United States Patent
Spoettl et al.

(10) Patent No.: US 10,223,629 B2
(45) Date of Patent: Mar. 5, 2019

(54) MULTICOLORED LOGO ON SMART CARD MODULES

(71) Applicant: Infineon Technologies AG, Neubiberg (DE)

(72) Inventors: Thomas Spoettl, Mintraching (DE);
Frank Pueschner, Kelheim (DE);
Peter Stampka, Burglengenfeld (DE);
Mathias Belzner, Cadolzburg (DE);
Ralph Domnick, Buckendorf (DE);
Daniel Weiss, Hessdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/726,417

(22) Filed: Oct. 6, 2017

(65) Prior Publication Data
US 2018/0101758 A1  Apr. 12, 2018

(30) Foreign Application Priority Data

Oct. 7, 2016 (DE) .................. 10 2016 119 081

(51) Int. Cl.
*G06K 19/06* (2006.01)
*G06K 19/07* (2006.01)
*G06K 19/077* (2006.01)
*H01L 23/498* (2006.01)

(52) U.S. Cl.
CPC ... *G06K 19/0723* (2013.01); *G06K 19/07718* (2013.01); *H01L 23/49855* (2013.01)

(58) Field of Classification Search
CPC ............ G06K 19/07749; G07F 7/1008; G06Q 20/341

USPC ......................................................... 235/492
See application file for complete search history.

(56) References Cited

U.S. PATENT DOCUMENTS

| | | | |
|---|---|---|---|
| 7,337,967 B2 | 3/2008 | Latka et al. | |
| 2010/0025475 A1* | 2/2010 | Webb | B41M 3/14 235/488 |
| 2014/0021261 A1* | 1/2014 | Mosteller | G06K 19/07722 235/488 |
| 2014/0082247 A1* | 3/2014 | Buttner | G06K 7/0008 710/301 |
| 2015/0298484 A1* | 10/2015 | Motoi | B41M 5/26 428/29 |

FOREIGN PATENT DOCUMENTS

DE           10325564 B4    12/2008

* cited by examiner

*Primary Examiner* — Ahshik Kim
(74) *Attorney, Agent, or Firm* — Viering, Jentschura & Partner mbB

(57) ABSTRACT

In various embodiments, a smart card module is provided. The smart card module may include an electronic circuit in or on a carrier, a smart card module contact layer, which is coupled to the electronic circuit and provides a plurality of smart card module contacts, a mirror layer on the smart card module contact layer, said mirror layer at least partly covering the smart card module contacts, and an optically translucent, electrically conductive oxide layer, which covers the mirror layer. The optically translucent, electrically conductive oxide layer includes a plurality of regions of different layer thicknesses for providing different color components.

25 Claims, 11 Drawing Sheets

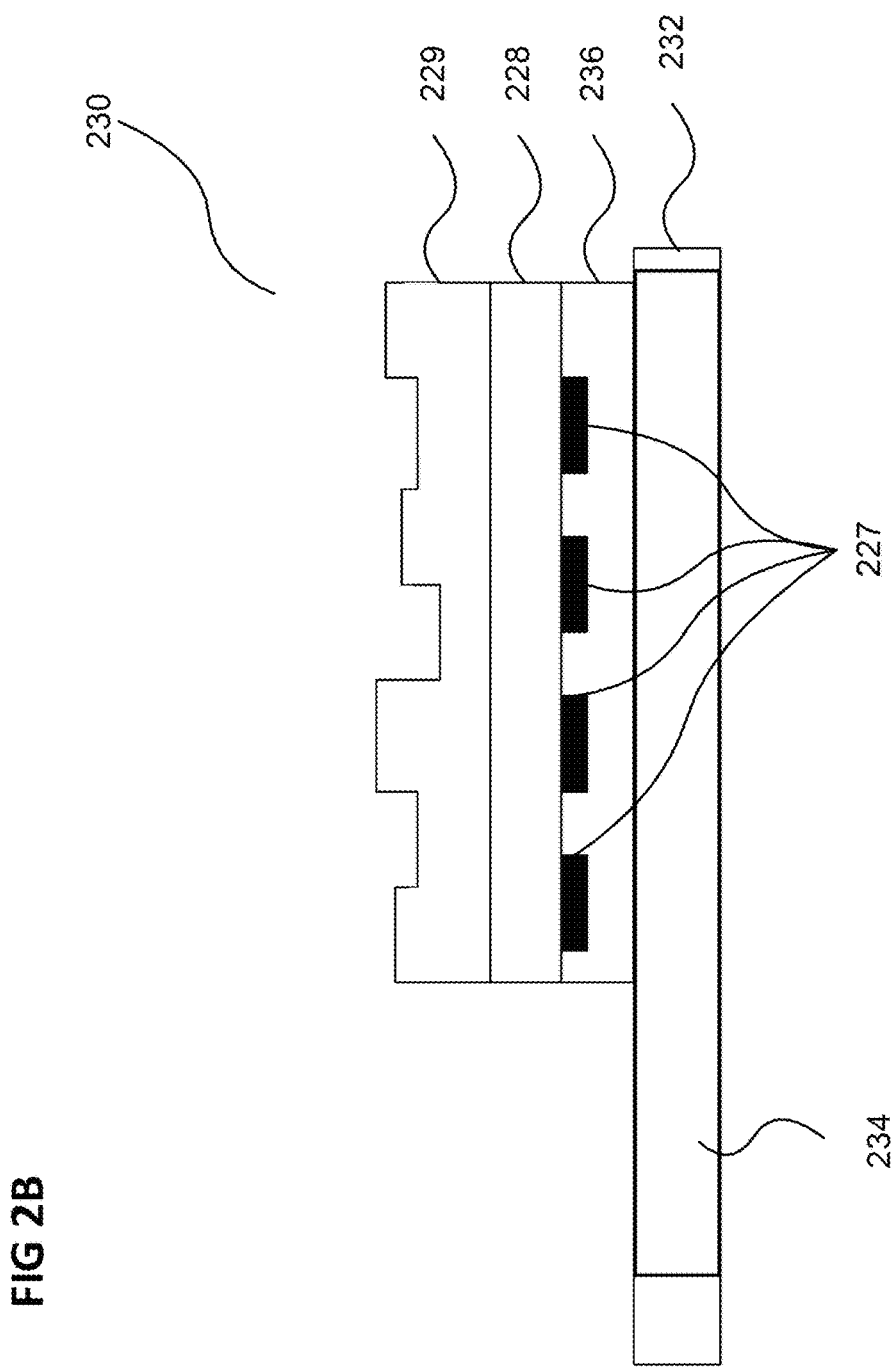

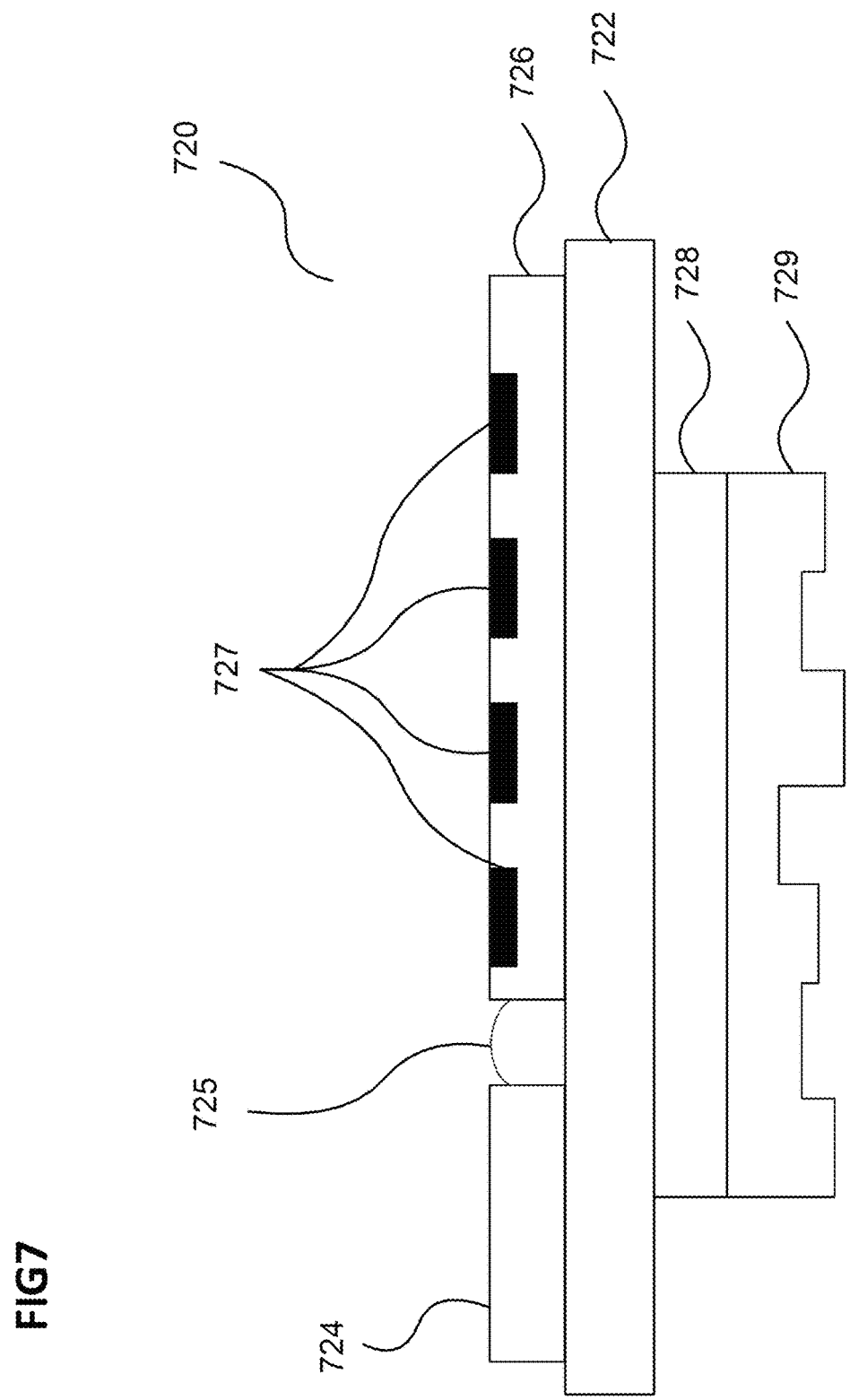

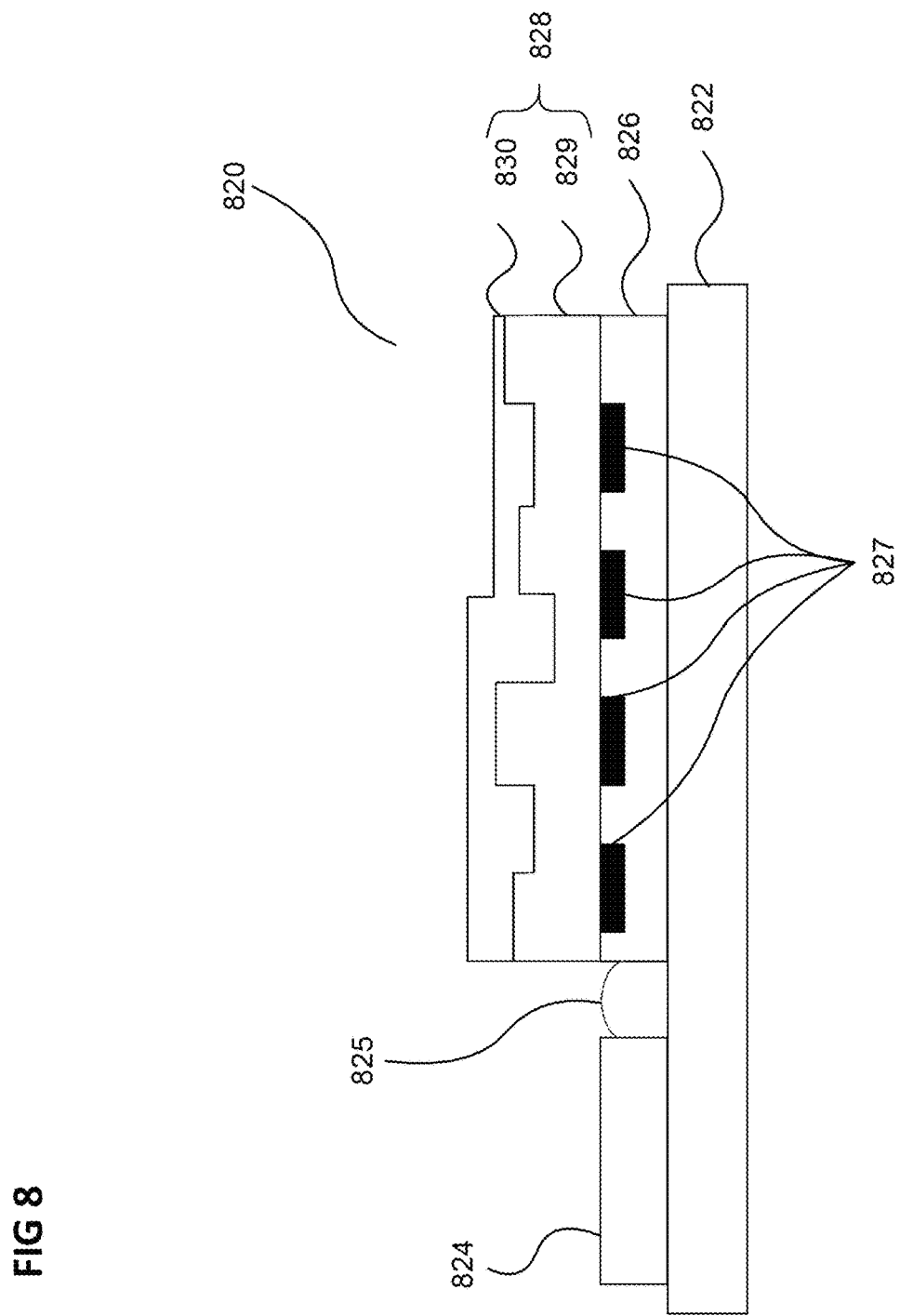

MULTICOLORED LOGO ON SMART CARD MODULES

CROSS-REFERENCE TO RELATED APPLICATION

This application claims priority to German Patent Application Serial No. 10 2016 119 081.0, which was filed Oct. 7, 2016, and is incorporated herein by reference in its entirety.

TECHNICAL FIELD

Various embodiments relate generally to a multicolored logo on a smart card module and to a method for producing a multicolored logo on a smart card module.

BACKGROUND

Smart cards have long been used for example as bank cards, identity cards and telephone cards or the like. On account of the further increasing number of possibilities for application of such smart cards and the associated increasing number of smart cards used daily by each user, aspects concerning recognition, differentiability of the cards of different providers or their functions and, associated therewith, safety in the use of the smart card are becoming more and more important.

In this case, in every day dealings the user has already become accustomed to the fact that the body of the smart cards is produced from varicolored plastic that is fashioned for example in a color that identifies the company that issues the respective card, and additionally bears for example the name of the company as lettering or a logo.

This colored configuration of the smart card body co-ordinated with the company affords the possibility of rapidly recognizing a specific smart card among other smart cards. However, it consists of conventional plastics, can easily be counterfeited and offers no security whatsoever that the smart card module integrated into the smart card also actually originates from the company mentioned on the smart card.

In order to ensure universal application of the smart cards, standards that determine the dimensions and technical details of the smart cards have been defined. Such standards are for example ISO 7810, relating to formats for identity documents, and ISO 7816, relating to identity cards with a contactless chip, so-called smart cards, and chips with contacts.

Depending on the field of use, smart cards are offered in a variety of variants, namely as the contactless smart cards already mentioned above, as smart cards "with contacts" and as combination cards. Here the last two in each case comprise a contact region, in which contacts corresponding to the specifications of the standard ISO 7816-2 in terms of their arrangement are provided. By means of said contacts, a circuit integrated in the smart card can be contacted externally, e.g. when data are read out in a specific reader. Said contacts are produced from a metal, for example Ni, Au and Pd, or an alloy comprising one of said metals. Separating channels are arranged between the individual contacts such that the contacts are electrically insulated from one another.

In this case the contact region of each card, said contact region including the contacts, hitherto has normally had the metallic color of the contacts themselves. In addition, for some time there has been the possibility of creating non-colored or single-colored images on the contact areas by means of metal etching.

FIG. 1 shows a schematic cross-sectional illustration of a construction/layer structure of a conventional single-colored coating of the contact region of a smart card module. In this case a metallic mirror layer 114, for example composed of chromium or high-grade steel, deposited on a surface 112 to be coated. Arranged on the metallic mirror layer 114 is a coloring layer 116 composed of indium tin oxide (ITO), which in turn can be overlaid with a metallic protective layer 118, for example composed of iron or gold. In this case, the color of the coloring layer 116 is dependent on the thickness of the coloring layer 116. To put it another way, the coloring layer 116 determines the optical impression, for example red or green or blue color depending on the thickness of the coloring layer 116.

However when the smart cards having a conventional single-colored coating of the contact region of the smart card module are used in everyday use, the gain in security on the basis of these single-colored images is very small.

SUMMARY

In various embodiments, a smart card module is provided. The smart card module may include an electronic circuit in or on a carrier, a smart card module contact layer, which is coupled to the electronic circuit and provides a plurality of smart card module contacts, a mirror layer on the smart card module contact layer, said mirror layer at least partly covering the smart card module contacts, and an optically translucent, electrically conductive oxide layer, which covers the mirror layer. The optically translucent, electrically conductive oxide layer includes a plurality of regions of different layer thicknesses for providing different color components.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2D show schematic cross-sectional illustrations of a smart card module in accordance with various embodiments;

FIG. 7 shows a schematic cross-sectional view of a smart card module in accordance with various embodiments; and FIG. 8 shows a schematic cross-sectional view of a smart card module in accordance with various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

FIG. 2A to FIG. 2D show schematic cross-sectional illustrations of a smart card module in accordance with various embodiments.

In various embodiments, component parts, materials, effects, dimensions, spacings, etc. of devices or parts thereof which are described in connection with FIG. 2B, FIG. 2C and FIG. 2D can correspond to those described in connection with FIG. 2A. A repetition can therefore be dispensed with, and the component parts, materials, effects, dimensions, spacings, etc. can be provided with the same reference signs insofar as is reasonable.

Figure 1:
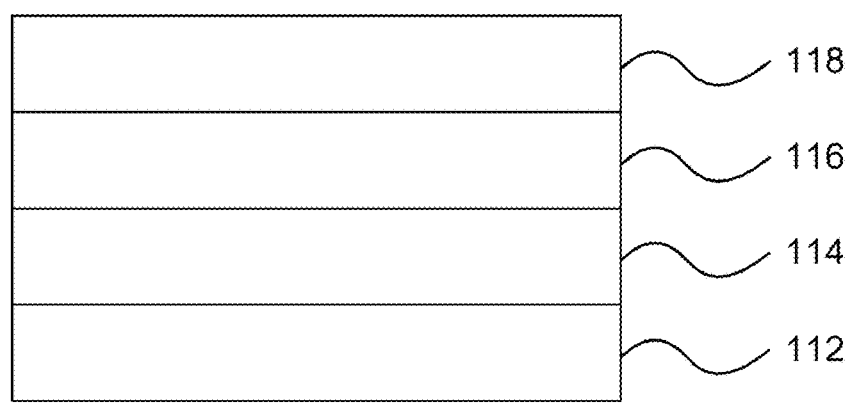
FIG. 1 shows a schematic cross-sectional illustrations of a layer structure of a conventional single-colored coating of the contact region of a smart card module.
Figure 2A:
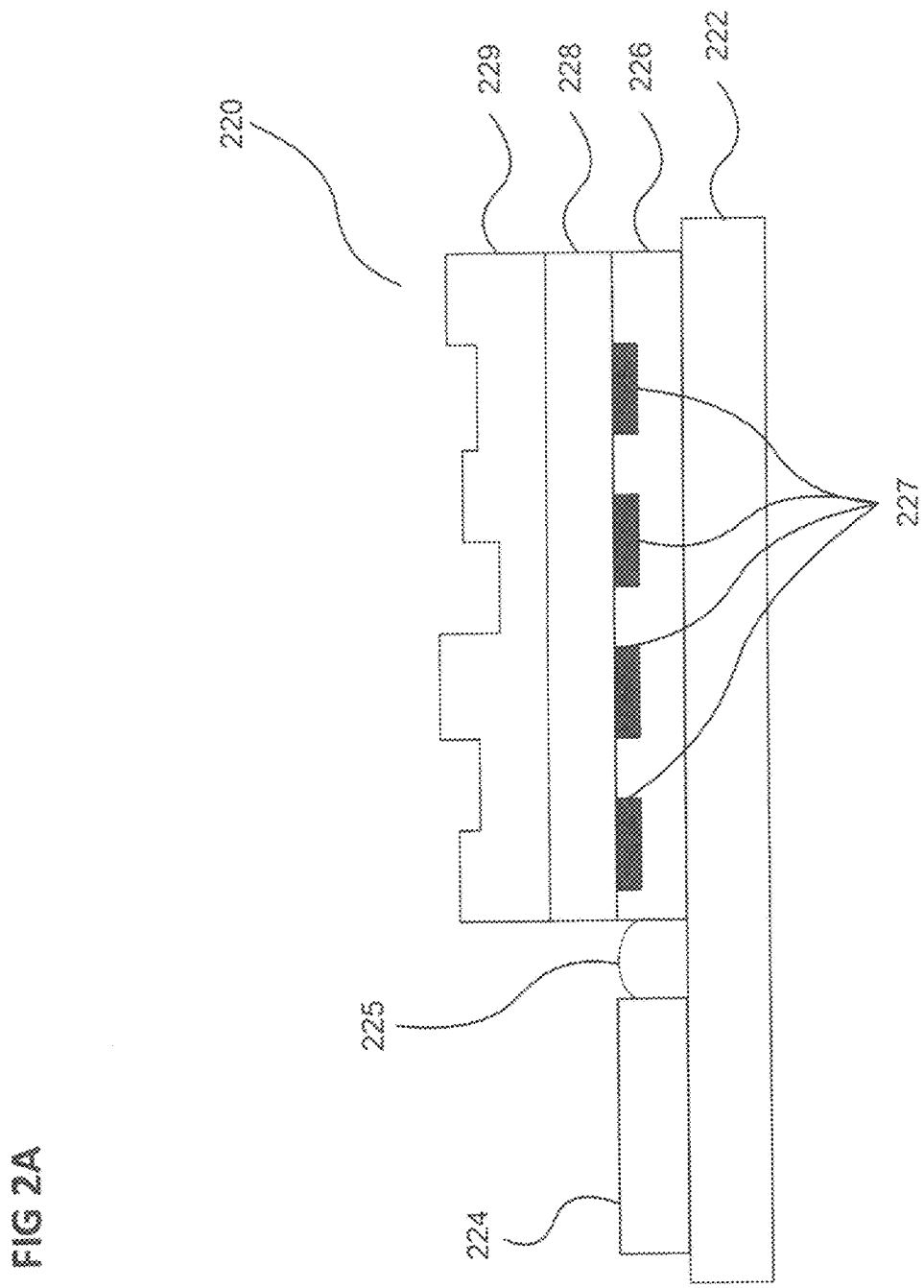

As illustrated in FIG. 2A, a smart card module 220 in accordance with various embodiments may include a carrier 222 on which an electronic circuit 224 can be arranged. The carrier 222 may include a polymer, for example epoxy resin, polyethylene terephthalate (PET), polyimide (PI), polycarbonate (PC), polyvinyl chloride (PVC), or it may include a leadframe composed of metals and/or metal oxides, such as, for example, copper, copper alloys, silver-plated copper, silver-plated copper alloys, gold-plated copper and gold-plated copper alloys, or a laminate material composed of polymer and metal, or can consist of one of these materials or of a mixture thereof.

The electronic circuit 224 may include or consist of an integrated circuit.

In various embodiments, the smart card module 220 can furthermore include a smart card module contact layer 226, which can likewise be arranged on the carrier 222. The smart card module contact layer 226 (or contact layer 226) may include a metal selected from a group consisting of the following materials: metal, e.g. nickel (Ni), gold (Au), palladium (Pd).

The contact layer 226 can be electrically coupled to the electronic circuit 224. The contact layer 226 can be electrically coupled, for example connected, to the electronic circuit 224 for example by means of a wiring 225.

In various embodiments, the contact layer 226 may include contacts 227, for example smart card module contacts 227. The contacts 227 can be provided on the contact layer 226. The contacts 227 can be embodied as a plurality of individual contacts 227. The plurality of contacts 227 can be arranged in accordance with the ISO 7816-2 standard. The contacts 227 can be separated, for example electrically insulated, from one another.

In various embodiments, a mirror layer 228 can be arranged on the contact layer 226, which mirror layer can cover the contacts 227. In various embodiments, the mirror layer 228 can completely cover the contacts 227, as illustrated in FIG. 2A. The mirror layer 228 can be formed from a metal, e.g. from chromium or high-grade steel. The mirror layer 228 can have a thickness in a range of approximately 40 nm to approximately 70 nm. By way of example, the mirror layer 228 can have a thickness in a range of approximately 50 nm to approximately 60 nm.

In various embodiments, the mirror layer 228 can be covered by an oxide layer 229. The oxide layer 229 can be formed from or include an optically translucent, electrically conductive material. The optically translucent, electrically conductive material may include or consist of indium tin oxide (ITO), for example. The oxide layer 229 may include a plurality of regions of different layer thicknesses, as illustrated by means of the stepped surface line of the oxide layer 229 in FIG. 2A.

In this case, in accordance with various embodiments, the layer thickness of the optically translucent, electrically conductive oxide layer, for example of the ITO layer, in each of the plurality of regions can be chosen in such a way that in each case light of a predefined wavelength is generated. Each region of the plurality of regions can have in each case a layer thickness in a range of approximately 50 nm to approximately 300 nm. The layer thickness of the optically translucent, electrically conductive oxide layer, for example of the ITO layer, for generating a blue color can be in a range of approximately 70 nm to approximately 110 nm, for example in a range of approximately 80 nm to approximately 100 nm, for generating a yellow color can be in a range of approximately 120 nm to approximately 180 nm, for example in a range of approximately 135 nm to approximately 165 nm, and for generating a red color can be in a range of approximately 40 nm to approximately 70 nm, for example in a range of approximately 50 nm to approximately 60 nm.

As an alternative to ITO, in various embodiments, the oxide layer can be formed from AZO (Al-doped zinc(II) oxide), FTO (F-doped tin(IV) oxide) and/or ATO (Sb-doped tin(IV) oxide).

FIG. 2B shows a schematic cross-sectional illustration of a smart card module in accordance with further various embodiments.

As is illustrated in FIG. 2B, a smart card module 230 in accordance with various embodiments may include a carrier 232. The carrier 232 may include a polymer, for example epoxy resin, polyethylene terephthalate (PET), polyimide (PI), polycarbonate (PC), polyvinyl chloride (PVC), a leadframe or a laminate material, or can consist of one of said materials or of a mixture thereof.

In accordance with various embodiments, an electronic circuit 234 can be arranged in the carrier 232, as illustrated in FIG. 2B. In accordance with various embodiments, the electronic circuit 234 can be integrated into the carrier 232, for example. The electronic circuit 234 may include or consist of an integrated circuit.

In various embodiments, the smart card module 230 can furthermore include a smart card module contact layer 236, which can be arranged on the carrier 232. The smart card module contact layer 236 (or contact layer 236 can be arranged on the electronic circuit 234. In various embodiments, the contact layer 236 can be electrically coupled to the electronic circuit 234. The contact layer 236 can be electrically coupled, for example connected, to the electronic circuit 234 by means of a wiring (not illustrated), for example. The contact layer 236 can be arranged on the electronic circuit 234 and can be electrically coupled, for example connected, for example directly thereto.

The smart card module contact layer 236 may include a metal selected from a group consisting of the following materials: metal, e.g. nickel (Ni), gold (Au), palladium (Pd).

In various embodiments, the contact layer 236 may include contacts 227, for example smart card module contacts 227. The contacts 227 can be provided on the contact layer 326. The contacts 227 can be embodied as a plurality of individual contacts 227. The plurality of contacts 227 can be arranged in accordance with the ISO 7816-2 standard. The contacts 227 can be separated, for example electrically insulated, from one another.

In various embodiments, a mirror layer 228 can be arranged on the contact layer 236, which mirror layer can cover the contacts 227. In various embodiments, the mirror layer 228 can completely cover the contacts 227. The mirror layer 228 can be formed from a metal, e.g. from chromium or high-grade steel.

In various embodiments, the mirror layer 228 can be covered by an oxide layer 229. The oxide layer 229 can be formed from or include an optically translucent, electrically conductive material. The optically translucent, electrically conductive material may include or consist of indium tin oxide (ITO), for example. The oxide layer 229 may include a plurality of regions of different layer thicknesses, as illustrated by means of the stepped surface line of the oxide layer 229 in FIG. 2B.

Figure 2C:
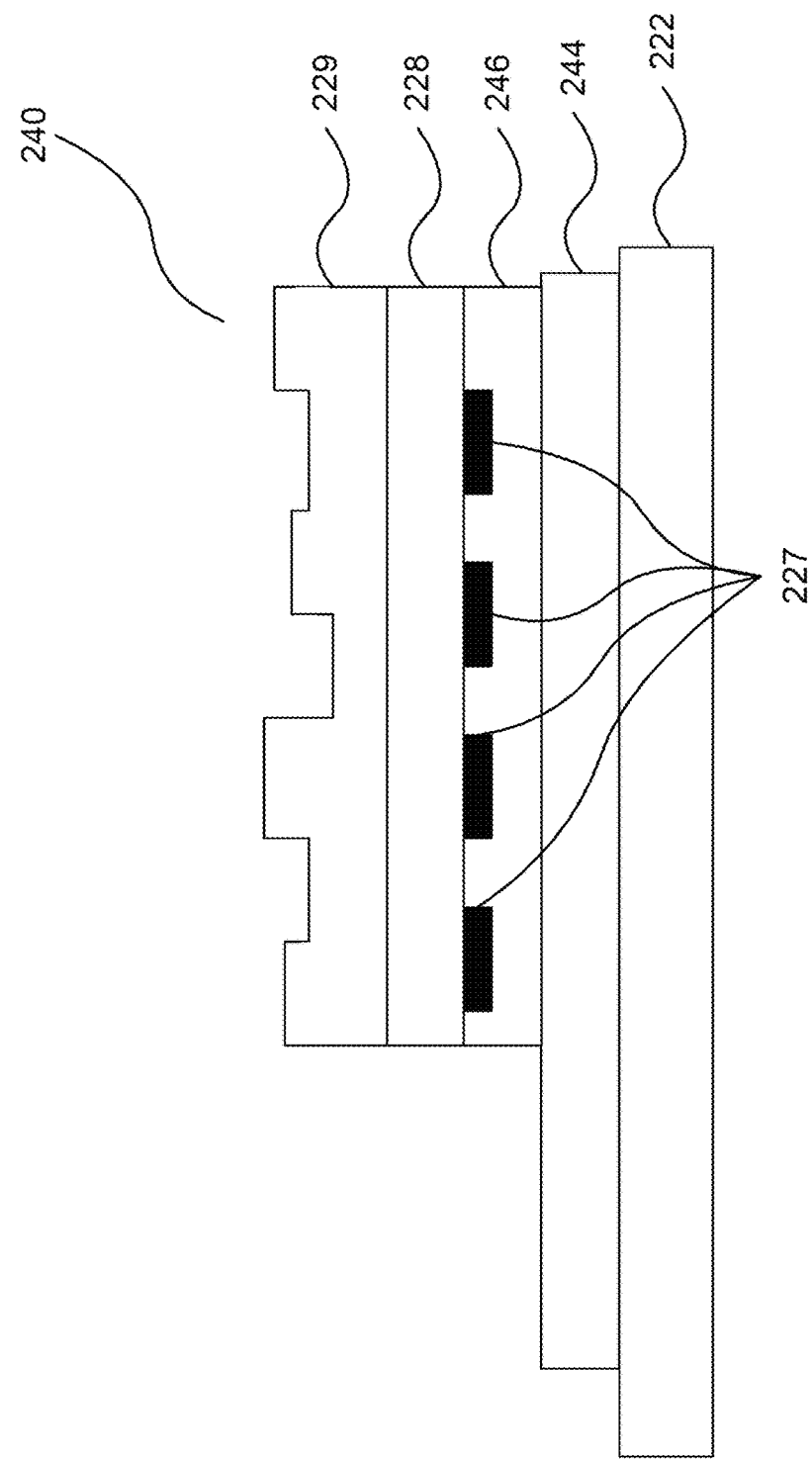

FIG. 2C shows a schematic cross-sectional illustration of a smart card module in accordance with further various embodiments.

As is illustrated in FIG. 2C, a smart card module 240 in accordance with various embodiments may include a carrier 222. The carrier 222 may include a polymer, for example epoxy resin, polyethylene terephthalate (PET), polyimide (PI), polycarbonate (PC), polyvinyl chloride (PVC), a leadframe or a laminate material, or may consist of one of said materials or of a mixture thereof.

In accordance with various embodiments, an electronic circuit 244 can be arranged on the carrier 222, as illustrated in FIG. 2C. The electronic circuit 244 may include or essentially consist of an integrated circuit.

In various embodiments, the smart card module 240 can furthermore include a smart card module contact layer 246, which can be arranged on the carrier 222. The smart card module contact layer 246 (or contact layer 246) can be arranged on the electronic circuit 244, as illustrated in FIG. 2C.

In various embodiments, the contact layer 246 can be electrically coupled to the electronic circuit 244. The contact layer 246 can be electrically coupled, for example connected, to the electronic circuit 244 by means of a wiring (not illustrated), for example. The contact layer 246 can be arranged on the electronic circuit 244 such that it can be electrically coupled, for example connected, for example directly thereto.

The smart card module contact layer 246 may include a metal or a polymer selected from a group consisting of the following materials: metal, e.g. nickel (Ni), gold (Au), palladium (Pd), and also polymer.

In various embodiments, the contact layer 246 may include contacts 227, for example smart card module contacts 227. The contacts 227 can be provided on the contact layer 246. The contacts 227 can be embodied as a plurality of individual contacts 227. The plurality of contacts 227 can be arranged in accordance with the ISO 7816-2 standard. The contacts 227 can be separated, for example electrically insulated, from one another.

In various embodiments, a mirror layer 228 can be arranged on the contact layer 246, which mirror layer can cover the contacts 227. In various embodiments, the mirror layer 228 can completely cover the contacts 227. The mirror layer 228 can be formed from a metal, e.g. from chromium or high-grade steel.

In various embodiments, the mirror layer 228 can be covered by an oxide layer 229. The oxide layer 229 can be formed from or include an optically translucent, electrically conductive material. The optically translucent, electrically conductive material may include or consist of indium tin oxide (ITO), for example. The oxide layer 229 may include a plurality of regions of different layer thicknesses, as illustrated by means of the stepped surface line of the oxide layer 229 in FIG. 2C.

Figure 2D:
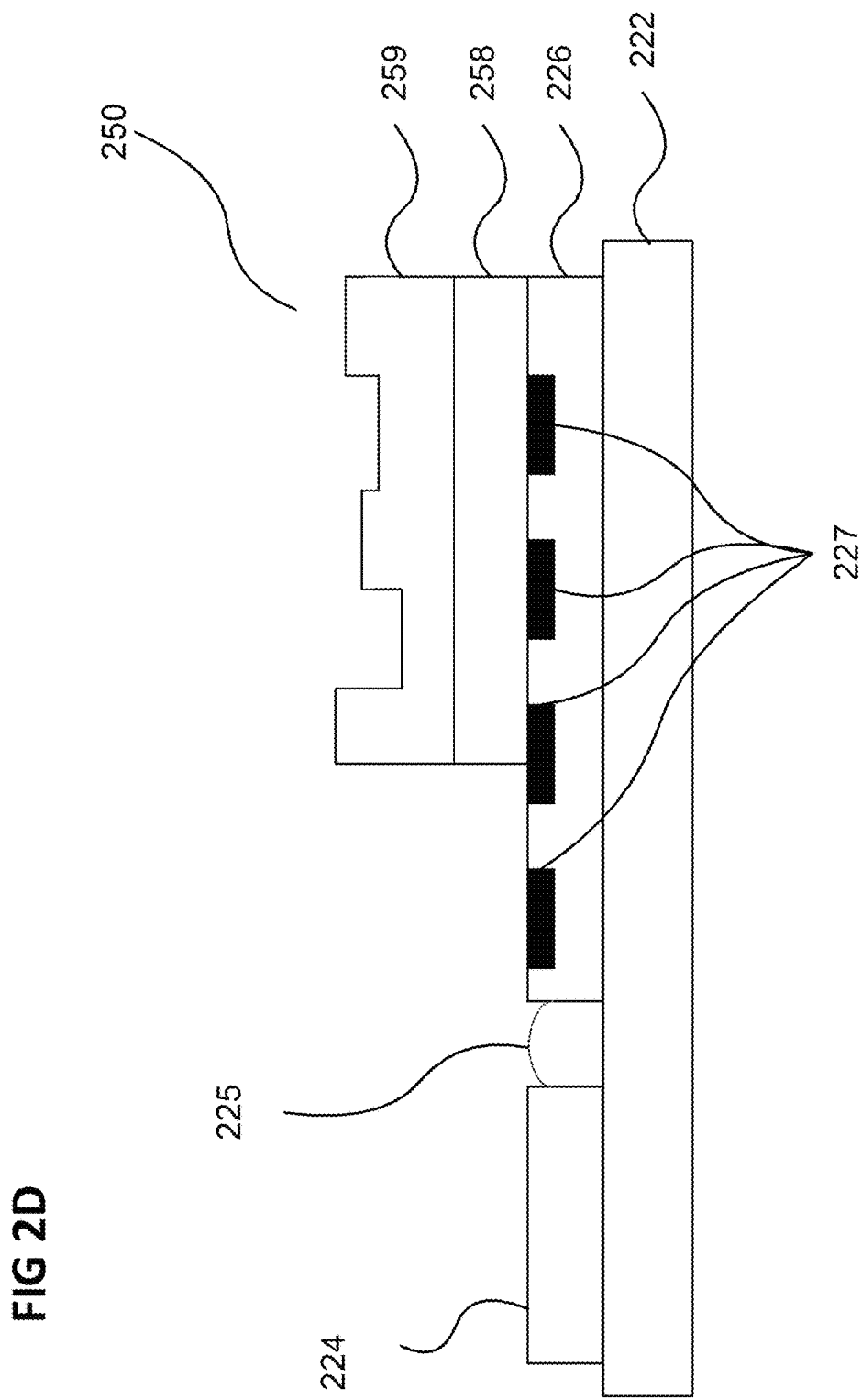

FIG. 2D shows a schematic cross-sectional illustration of a smart card module in accordance with further various embodiments.

As is illustrated in FIG. 2D, a smart card module 250 in accordance with various embodiments may include a carrier 222. The carrier 222 may include a polymer, for example epoxy resin, polyethylene terephthalate (PET), polyimide (PI), polycarbonate (PC), polyvinyl chloride (PVC), a leadframe or a laminate material, or may essentially consist of one of said materials or of a mixture thereof.

In accordance with various embodiments, an electronic circuit 224 can be arranged on the carrier 222. The electronic circuit 224 may include or consist of an integrated circuit.

In various embodiments, the smart card module 250 can furthermore include a smart card module contact layer 226, which can be arranged on the carrier 222. In various embodiments, the contact layer 226 can be electrically coupled to the electronic circuit 224. The contact layer 226 can be electrically coupled, for example connected, to the electronic circuit 224 by means of a wiring 225, for example.

The smart card module contact layer 226 may include a metal or a polymer selected from a group consisting of the following materials: metal, e.g. nickel (Ni), gold (Au), palladium (Pd), and also polymer.

In various embodiments, the contact layer 226 may include contacts 227, for example smart card module contacts 227. The contacts 227 can be provided on the contact layer 226. The contacts 227 can be embodied as a plurality of individual contacts 227. The plurality of contacts 227 can be arranged in accordance with the ISO 7816-2 standard. The contacts 227 can be separated, for example electrically insulated, from one another.

In various embodiments, a mirror layer 258 can be arranged on the contact layer 226, which mirror layer can cover the contacts 227. In various embodiments, a mirror layer 258 can be arranged on the contact layer 226, which mirror layer can partly cover the contacts 227, as illustrated in FIG. 2D. The mirror layer 258 can be formed from a metal, e.g. from chromium or high-grade steel.

In various embodiments, the mirror layer 258 can be covered by an oxide layer 259. The oxide layer 259 can be formed from or include an optically translucent, electrically conductive material. The optically translucent, electrically conductive material may include or essentially consist of indium tin oxide (ITO), for example. The oxide layer 259 may include a plurality of regions of different layer thicknesses, as illustrated by means of the stepped surface line of the oxide layer 259 in FIG. 2D.

Figure 3:
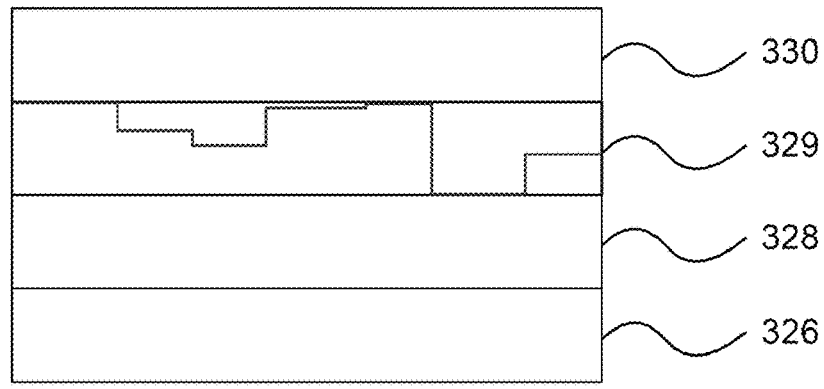
FIG. 3 shows an enlarged schematic cross-sectional illustration of a layer structure of a multi-colored coating of the contact region of the smart card module, for example from FIG. 2A to FIG. 2D, in accordance with various embodiments.

FIG. 3 shows an enlarged schematic cross-sectional illustration of a layer structure of a multicolored coating of the contact region of the smart card module from FIG. 2A to FIG. 2D in accordance with various embodiments.

In the layer structure—illustrated in FIG. 3—of a multicolored coating of the contact region of the smart card module from FIG. 2A to FIG. 2D in accordance with various embodiments, a metallic mirror layer 328 is deposited on a surface to be coated. The surface to be coated may include metal or polymer or consist of metal or polymer. In various embodiments, the surface to be coated, as illustrated in FIG. 3, can be formed by means of the smart card module contact layer 326 (or contact layer 326). In various embodiments, the contact layer 326 may include a plurality of contacts (not illustrated), which can be separated, for example electrically insulated, from one another by means of boundary lines (not illustrated). The contact layer 326 may include or essentially consist of a metal selected from a group consisting of the following materials: metal, e.g. nickel (Ni), gold (Au), palladium (Pd).

As explained above, the mirror layer 328 can at least partly or completely cover the contacts (not illustrated) of the contact layer 326. The mirror layer 328 can be a metallic mirror layer. The metallic mirror layer can optionally include chromium or iron. To put it another way, the metallic mirror layer can be formed from a metal, e.g. from chromium or high-grade steel.

In various embodiments, the metallic mirror layer 328 can be covered by an oxide layer 329. The oxide layer 329 may include or be formed from an optically translucent, electrically conductive material. The optically translucent, electrically conductive material can be indium tin oxide (ITO), for example. In this case, the oxide layer 329 may include a plurality of regions of different layer thicknesses, as illustrated by means of the stepped surface line of the oxide layer 329 in FIG. 3.

In this case, depending on the respective layer thickness, to put it another way depending on the respective layer thickness of the ITO layer 329, in the plurality of regions the oxide layer 329 can exhibit different colors. The plurality of regions of different layer thicknesses of the oxide layer 329 can have a previously defined structure. The previously defined structure may include a multicolored complex representation. The structure having different thicknesses of the ITO layer 329 can optically appear as a multicolored complex representation, for example a specific multicolored complex pattern. To put it another way, a multicolored representation, for example a multicolored pattern, can arise by means of the structuring of the ITO layer on the basis of the previously defined structure.

To put it another way, the optically translucent, electrically conductive oxide layer 329 in accordance with various embodiments thus includes a plurality of regions of different layer thicknesses for providing different color components.

In this case, the optically translucent, electrically conductive oxide layer 329 in each of the plurality of regions of different layer thicknesses can be chosen in such a way that in each case light of a predefined wavelength is generated. To put it another way, the multicolored representation that arises as a result of the previously defined structure of the oxide layer 329 can have, at previously defined locations, layer thicknesses which engender a specific color impression for the user.

In various embodiments, the respective layer thicknesses of the plurality of regions of the optically translucent, electrically conductive oxide layer 329 can thus be chosen such that a predefined verification pattern is formed, for example arises.

In various embodiments, each region of the plurality of regions of different layer thicknesses of the oxide layer 329 can have in each case a layer thickness in a range of approximately 50 nm to approximately 300 nm.

In various embodiments, the layer thickness of the oxide layer 329 for generating a blue color can be in a range of approximately 70 nm to approximately 110 nm, for example in a range of approximately 80 nm to approximately 100 nm, for generating a yellow color can be in a range of approximately 120 nm to approximately 180 nm, for example in a range of approximately 135 nm to approximately 165 nm, and for generating a red color can be in a range of approximately 40 nm to approximately 70 nm, for example in a range of approximately 50 nm to approximately 60 nm.

The smart card module including a multicolored representation as described here provides a verification pattern with the aid of which, for example, the origin of a smart card module of a smart card can be verified and a required degree of security can thus be ensured. As explained above, multicolored representations, such as multicolored patterns, for example, are appropriate for this purpose since on the basis thereof the user can very easily visually verify the authenticity, as a result of which the security of the smart card can be considerably increased. The multicolored representation can as necessary contain a logo, the memorability of which can be very high, as a result of which the verification of the authenticity of the smart card is further simplified. As a result, they increase a demanded degree of security.

Said degree of security can be ensured for example by the fact that, in accordance with the present application, multicolored, almost arbitrarily complex representations are created on the contact region of the smart card module according to stipulations, i.e. specifically in accordance with the concepts of the card-issuing office or firm, such as a bank, for example. Since the user, with the aid of said multicolored representation, can very easily visually verify the authenticity of the smart card module integrated into the smart card, the security of the smart card can thus be considerably increased. Even a relatively simple multicolored representation, such as a standard logo, for example, can offer a security effect as a verification pattern on account of the high memorability, since detailed knowledge and suitable equipment are required to produce such multicolored representations, for which reason production is non-trivial.

In accordance with various embodiments, a metallic protective layer 330 can be formed above the oxide layer 329 including a plurality of regions of different layer thicknesses.

To put it another way, the oxide layer 329 including a plurality of regions of different layer thicknesses can be overlaid with a metallic protective layer 330. The metallic protective layer 330 can for example include iron or gold or substantially consist of iron or gold. The metallic protective layer 330 can have a thickness in a range of approximately 8 nm to 12 nm. By way of example, the metallic protective layer 330 can have a thickness in a range of approximately 9 nm to approximately 11 nm.

Figure 4:
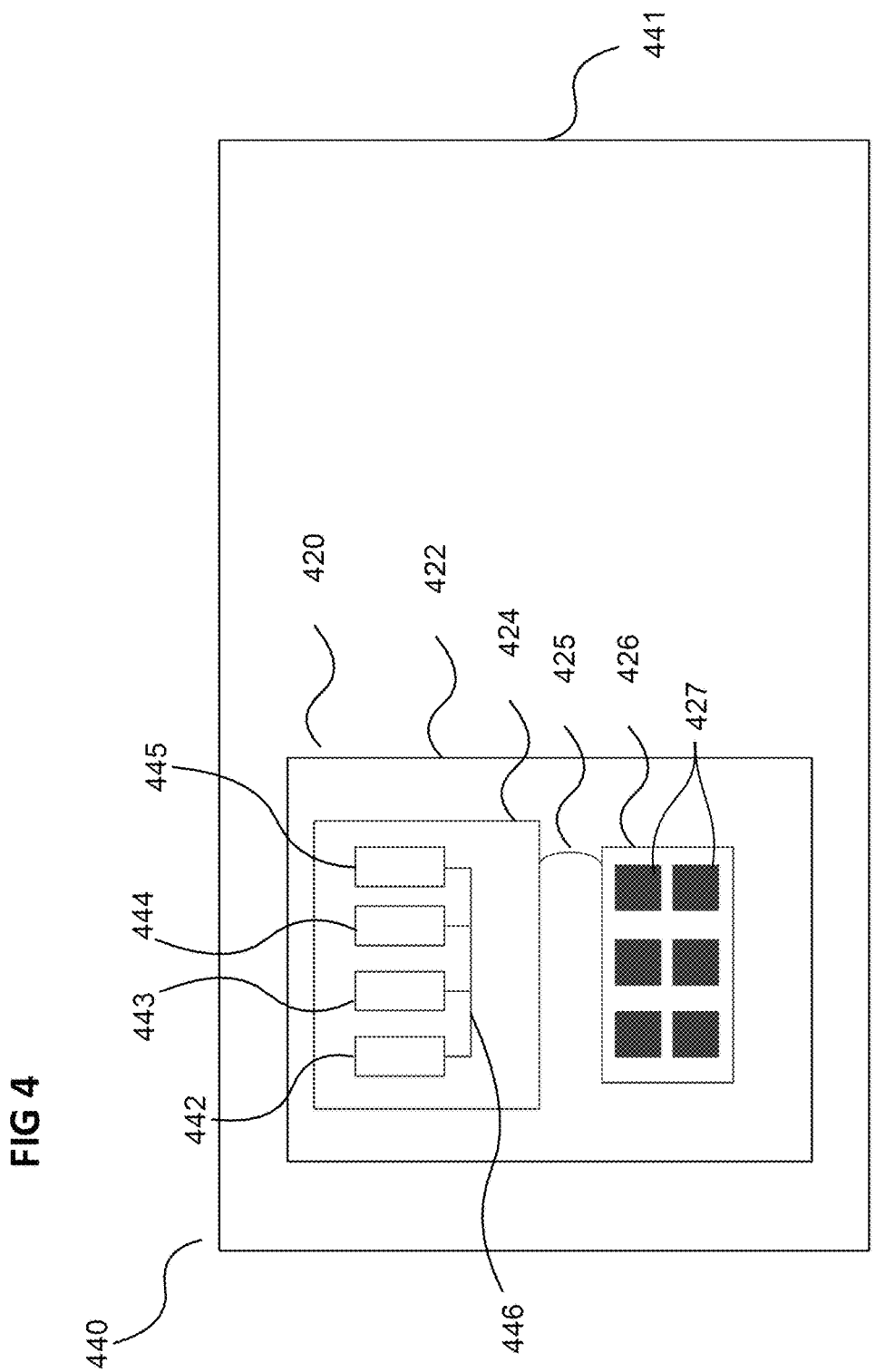
FIG. 4 shows a schematic cross-sectional illustration of a smart card in accordance with various embodiments.

FIG. 4 shows a schematic cross-sectional illustration of a smart card in accordance with various embodiments.

In various embodiments, a smart card 440 may include a smart card body 441. In various embodiments, the smart card body 441 may include a polymer material, for example PET and/or PI. By way of example, the smart card body 441 can be formed in a multilayered fashion, for example include a laminate material.

Furthermore, in various embodiments, the smart card 440 may include a smart card module 420 embedded into the smart card body 441. The smart card module 420 may include an electronic circuit 424 and a smart card module contact layer 426 (or contact layer 426) including a plurality of contacts 427, which are arranged on a carrier 422. The electronic circuit 424 and the contact layer 426 can be electrically coupled to one another, for example by means of a wiring 425. The electronic circuit 424 may include a processor 442, a memory 443, a transmitter 444 and a receiver 445, wherein the individual component parts of the electronic circuit 424 can be electrically coupled by means of a bus 446.

Figure 5:
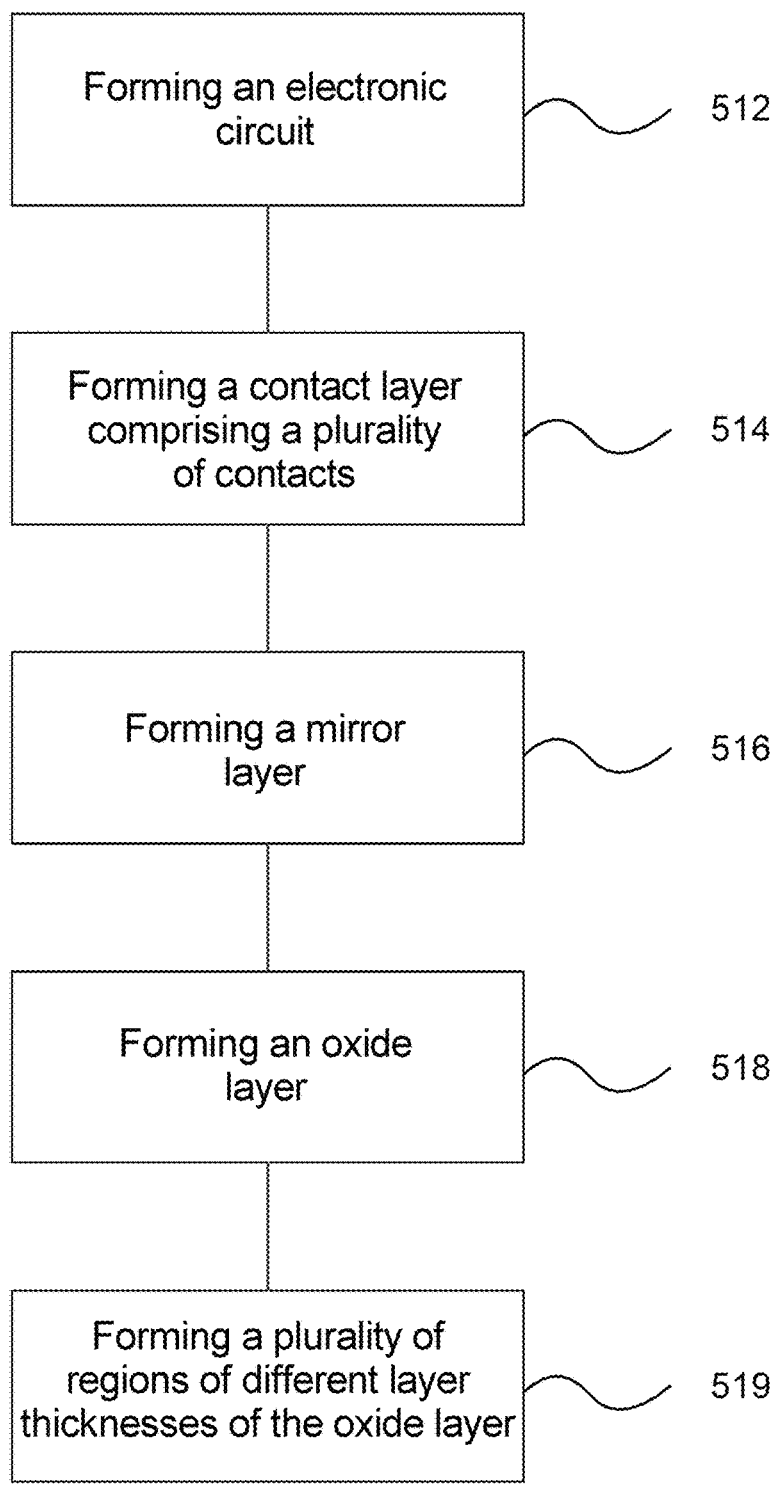
FIG. 5 shows a flow diagram of a method for producing a smart card module in accordance with various embodiments.

FIG. 5 shows a flow diagram of a method for producing a smart card module in accordance with various embodiments.

In accordance with various embodiments, a method for producing a smart card module may include: forming an electronic circuit in or on a carrier, 512; forming a smart card module contact layer, which is coupled to the electronic circuit and provides a plurality of smart card module contacts, 514; forming a mirror layer on the smart card module contact layer, said mirror layer at least partly covering the smart card module contacts, 516; providing different color components by means of forming an optically translucent, electrically conductive oxide layer, 518, which covers the mirror layer (for example with a plurality of regions of different layer thicknesses). In accordance with various embodiments, in this case forming an oxide layer 518 (for example including a plurality of regions of different layer thicknesses) may include forming a plurality of regions of different layer thicknesses of the oxide layer, 519.

The oxide layer may include or be formed from an optically translucent, electrically conductive material. The optically translucent, electrically conductive material can be indium tin oxide (ITO), for example.

In this case, the optically translucent, electrically conductive oxide layer in each of the plurality of regions of different layer thicknesses can be chosen in such a way that in each case light of a predefined wavelength is generated. To put it another way, the multicolored representation that arises as a result of the previously defined structure of the oxide layer can have, at previously defined locations, layer thicknesses which engender a specific color impression for the user.

In various embodiments, the respective layer thicknesses of the plurality of regions of the optically translucent, electrically conductive oxide layer can thus be chosen such that a predefined verification pattern is formed, for example arises.

In various embodiments, each region of the plurality of regions of different layer thicknesses of the oxide layer can be formed in such a way that it has in each case a layer thickness in a range of approximately 50 nm to approximately 300 nm.

In various embodiments, the layer thickness of the oxide layer for generating a blue color can be formed in a range of approximately 70 nm to approximately 110 nm, for example in a range of approximately 80 nm to approximately 100 nm. In various embodiments, the layer thickness of the oxide layer for generating a yellow color can be formed in a range of approximately 120 nm to approximately 180 nm, for example in a range of approximately 135 nm to approximately 165 nm. In various embodiments, the layer thickness of the oxide layer for generating a red color can be formed in a range of approximately 40 nm to approximately 70 nm, for example in a range of approximately 50 nm to approximately 60 nm.

The method for producing a smart card module as described here provides a method for producing a smart card module including a multicolored representation, wherein, by means of the multicolored representation, a verification pattern can be provided with the aid of which, for example, the origin of a smart card module of a smart card can be verified and a demanded degree of security can thus be ensured. As explained above, multicolored representations are appropriate for this purpose since, on the basis thereof, the user can very easily visually verify the authenticity, as a result of which the security of the smart card can be considerably increased. The multicolored representation can as necessary contain a logo, the memorability of which can be very high, as a result of which the verification of the authenticity of the smart card is further simplified. As a result, they increase a demanded degree of security.

Said degree of security can be ensured for example by the fact that, in accordance with the present application, multicolored, almost arbitrarily complex representations can be created on the contact region of the smart card modules according to stipulations, i.e. specifically in accordance with the concepts of the card-issuing office or firm, such as a bank, for example. Since the user, with the aid of said multicolored representation, can very easily visually verify the authenticity of the smart card module integrated into the smart card, the security of the smart card can thus be considerably increased. Even a relatively simple multicolored representation, such as a standard logo, for example, can offer a security effect as a verification pattern on account of the high memorability, since detailed knowledge and suitable equipment are required to produce such multicolored representations, for which reason production is nontrivial.

In accordance with various embodiments, the method for producing a smart card module can furthermore include: forming a metallic protective layer above the oxide layer including a plurality of regions of different layer thicknesses. To put it another way, the method for producing a smart card module can furthermore include: forming a metallic protective layer above the optically translucent, electrically conductive oxide layer. The metallic protective layer can for example be formed from iron or gold or can be formed from a material which substantially consists of iron or gold.

In accordance with various embodiments, forming an optically translucent, electrically conductive oxide layer, 518, on the metallic mirror layer can be carried out by means of physical vapor deposition (PVD), as described below. In accordance with various embodiments, forming the plurality of regions of different layer thicknesses of the oxide layer, 519, can be carried out by means of structuring the oxide layer. In further various embodiments, the structuring can be carried out by means of a laser, as described below.

Further configurations of the method are evident from the description of the device, and vice versa.

Figure 6:
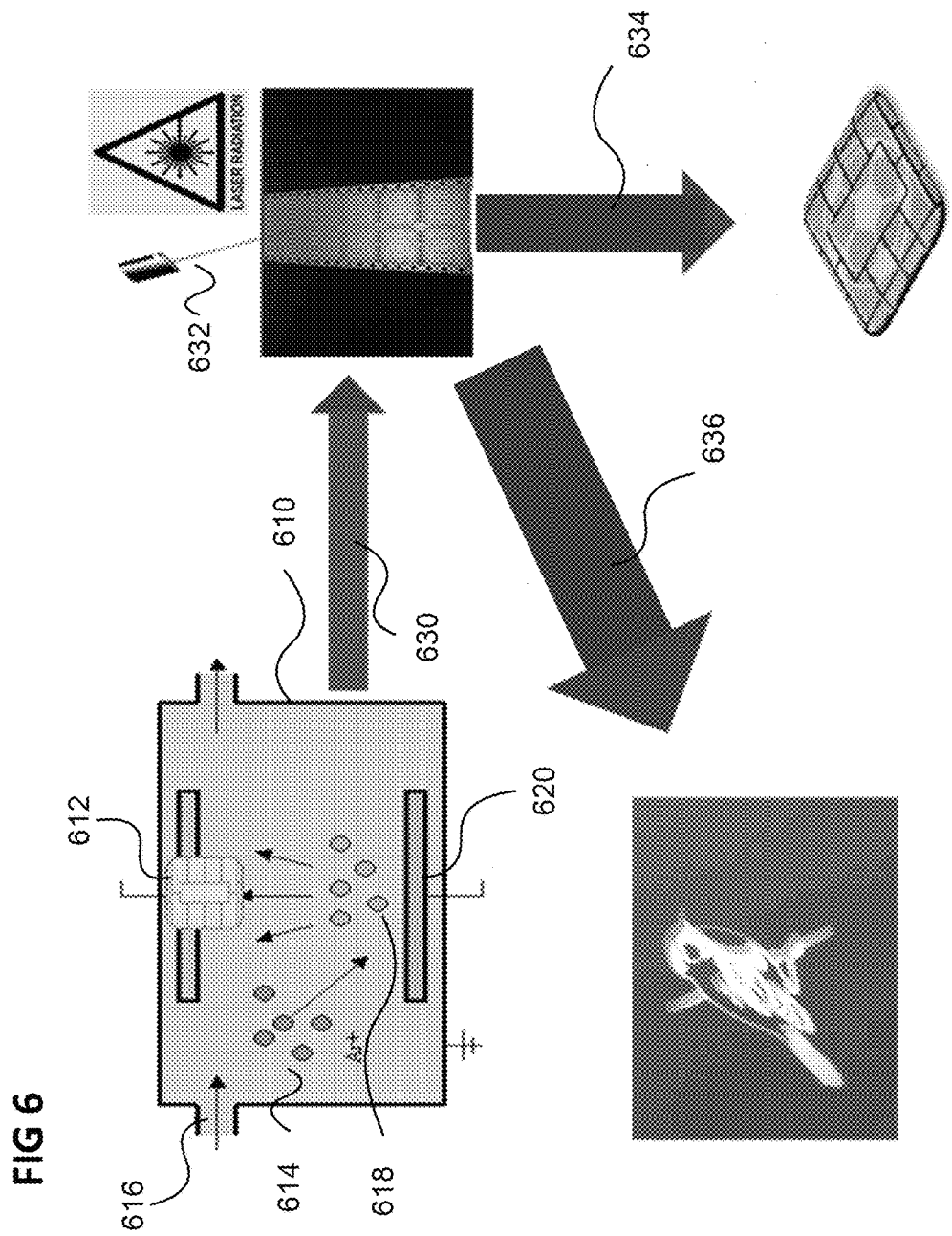
FIG. 6 shows a schematic illustration of the method for forming an optically translucent, electrically conductive oxide layer including a plurality of regions of different layer thicknesses in accordance with various embodiments.

FIG. 6 shows a schematic illustration of the method for forming an optically translucent, electrically conductive oxide layer including a plurality of regions of different layer thicknesses (steps 518 and 519 in FIG. 5) in accordance with various embodiments.

As explained above, forming the optically translucent, electrically conductive oxide layer, in various embodiments, can be carried out by means of physical vapor deposition (PVD). In a number of embodiments, forming the plurality of regions of different layer thicknesses of the oxide layer can be carried out by means of structuring by means of a laser.

As illustrated for various embodiments in FIG. 6, during the physical vapor deposition PVD, a substrate 612 including a contact layer having a plurality of contacts on a carrier can be introduced into a coating chamber 610. In the coating chamber 610, with the aid of argon ions 614, introduced into the coating chamber 610 as sputtering gas through a gas feed 616, ions 618 of the material 620 to be evaporated, here a metal oxide, for example ITO, can be formed and deposited on the substrate 612. In this case, by means of the PVD, one or a plurality of metal and/or metal oxide layers or combinations thereof can be applied to the surface of the substrate 612, for example the surface of the smart card module. The one or a plurality of metal oxide layers can in this case form the abovementioned optically translucent, electrically conductive oxide layer.

Afterward, the coated substrate can be fed to a laser treatment (arrow 630). In this case layers of the metal oxide layers, for example ITO layers, can be wholly or partly removed by means of a laser irradiation 632. A plurality of regions of different layer thicknesses of the ITO layer can be formed by means of the removal of the ITO layers by means of the laser irradiation 632. Said plurality of regions of different layer thicknesses can produce a corresponding color depending on the layer thickness.

In order to create multicolored representations, the layers can selectively be wholly or partly removed by the laser. Single-colored patterns can be produced by the removal of a single ITO layer or a plurality of ITO layers with uniform depth, for example as far as the surface of the substrate, for example of the contact layer, in the form of the pattern (arrow 634). Multicolored representations can be produced by the laser removing the ITO layers to different depths in such a way that, as described above, a plurality of regions of different layer thicknesses of the ITO layers can be formed (arrow 636). As a result, different interferences can arise which can reproduce different colors of the multicolored representation.

FIG. 7 shows a schematic cross-sectional view of a smart card module in accordance with various embodiments.

In various embodiments, a smart card module 720, as illustrated in FIG. 7, may include an electronic circuit 724 in or on a carrier 722. The carrier 722 may include a polymer, for example epoxy resin, polyethylene terephthalate (PET), polyimide (PI), polycarbonate (PC), polyvinyl chloride (PVC), a leadframe or a laminate material, or can consist of one of said materials or of a mixture thereof. In various embodiments, the electronic circuit 724 can be arranged on a front side of the smart card module 720. In various embodiments, however, the electronic circuit 724 can also be arranged on a rear side of the smart card module 720. The electronic circuit 724 may include or consist of an integrated circuit. In accordance with various embodiments, the electronic circuit 724 can be arranged in the carrier 722, for example can be integrated into the latter.

Furthermore, in various embodiments, the smart card module 720 may include a smart card module contact layer 726 (contact layer 726), which provides a plurality of smart card module contacts 727 on the front side of the smart card module 720. The smart card module contact layer 726 (or contact layer 726) may include a metal or a polymer selected from a group consisting of the following materials: metal, e.g. nickel (Ni), gold (Au), palladium (Pd), and also polymer.

In accordance with various embodiments the contact layer 726 can be coupled to the electronic circuit 724, for example by means of a wiring 725. In various embodiments, the contact layer 726, as described above, can also be arranged on the electronic circuit 724 and can be electrically coupled directly thereto.

The contacts 727 can be embodied as a plurality of individual contacts 727. The plurality of contacts 727 can be arranged in accordance with the ISO 7816-2 standard. The contacts 727 can be separated, for example electrically insulated, from one another.

In accordance with various embodiments, the smart card module 720 can furthermore include a mirror layer 728. In this case, the mirror layer 728 can be arranged on the rear side of the smart card module 720 which is opposite the front side of the smart card module 720. The mirror layer 728 can be formed from a metal, e.g. from chromium or high-grade steel. The mirror layer 728 can have a thickness in a range of approximately 40 nm to 70 nm. By way of example the mirror layer 728 can have a thickness in a range of approximately 50 nm to approximately 60 nm.

In various embodiments, an optically translucent, electrically conductive oxide layer 729 can be formed on the mirror layer 728, said oxide layer covering the mirror layer 728. The oxide layer 729 can be formed from or include an optically translucent, electrically conductive material. The optically translucent, electrically conductive material may include or be indium tin oxide (ITO), for example. In various embodiments, the optically translucent, electrically conductive oxide layer 729, for providing different color components, may include a plurality of regions of different layer thicknesses, as illustrated by means of the stepped surface line of the oxide layer 729 in FIG. 7.

The smart card module 720 can have the variations and modifications described above for the smart card modules 220, 230, 240 and 250.

FIG. 8 shows a schematic cross-sectional view of a smart card module in accordance with various embodiments.

In various embodiments, a smart card module 820, as illustrated in FIG. 8, may include an electronic circuit 824 in or on a carrier 822. The carrier 822 may include a polymer, for example epoxy resin, polyethylene terephthalate (PET), polyimide (PI), polycarbonate (PC), polyvinyl chloride (PVC), a leadframe or a laminate material, or can consist of one of said materials or of a mixture thereof. In various embodiments, the electronic circuit 824 can be arranged on a front side of the smart card module 820. In various embodiments, however, the electronic circuit 824 can also be arranged on a rear side of the smart card module 820. The electronic circuit 824 may include or consist of an integrated circuit. In accordance with various embodiments, the electronic circuit 824 can be arranged in the carrier 822, for example can be integrated into the latter.

Furthermore, in various embodiments, the smart card module 820 may include a smart card module contact layer 826 (contact layer 826), which provides a plurality of smart card module contacts 827 on the front side of the smart card module 820. The smart card module contact layer 826 (or contact layer 826) may include a metal or a polymer selected from a group consisting of the following materials: metal, e.g. nickel (Ni), gold (Au), palladium (Pd), and also polymer.

In accordance with various embodiments the contact layer 826 can be coupled to the electronic circuit 824, for example by means of a wiring 825. In various embodiments, the contact layer 826, as described above, can also be arranged on the electronic circuit 824 and can be electrically coupled directly thereto.

The contacts 827 can be embodied as a plurality of individual contacts 827. The plurality of contacts 827 can be arranged in accordance with the ISO 7816-2 standard. The contacts 827 can be separated, for example electrically insulated, from one another.

In accordance with various embodiments, the smart card module 820 can furthermore include a layer stack 828. The layer stack 828 can in this case be arranged on the front side of the smart card module 820. As described above, the layer stack 828 can also be arranged on the rear side of the smart card module 820 which is opposite the front side of the smart card module 820.

In various embodiments, the layer stack 828 may include at least one optically translucent, electrically conductive oxide layer 829. In various embodiments, the oxide layer 829 can be formed from or include an optically translucent, electrically conductive material. The optically translucent, electrically conductive material may include or be indium tin oxide (ITO), for example. In various embodiments, the oxide layer 829 can be a first optically translucent, electrically conductive oxide layer 829 (or a first oxide layer 829).

In accordance with various embodiments, the layer stack 828 may include at least one second optically translucent, electrically conductive oxide layer (not illustrated), wherein the first optically translucent, electrically conductive oxide layer 829 and the second optically translucent, electrically conductive oxide layer (not illustrated) are separated from one another by means of an additional layer (not illustrated).

In accordance with various embodiments, the additional layer (not illustrated) can be a metallic layer, which optionally includes or essentially consists of chromium or iron. In various embodiments, the additional layer can have a thickness which is in a range of approximately 3 nm to approximately 20 nm, optionally in a range of approximately 5 nm to approximately 15 nm.

In various embodiments, the first optically translucent, electrically conductive oxide layer 829 and the second optically translucent, electrically conductive oxide layer (not illustrated), for providing different color components, can have a plurality of regions of different layer thicknesses, as illustrated by means of the stepped surface line for the first oxide layer 829 in FIG. 8.

In accordance with various embodiments, the layer thickness of the first optically translucent, electrically conductive oxide layer 829 for generating a red color can be in a range of approximately 120 nm to approximately 150 nm, optionally in a range of approximately 130 nm to approximately 140 nm. In various embodiments, the layer thickness of the first optically translucent, electrically conductive oxide layer 829 for generating an orange color can be in a range of approximately 90 nm to approximately 120 nm, optionally in a range of approximately 100 nm to approximately 110 nm. In various embodiments, the layer thickness of the first optically translucent, electrically conductive oxide layer 829 for generating an anthracite-gray color can be in a range of approximately 40 nm to approximately 70 nm, optionally in a range of approximately 50 nm to approximately 60 nm.

In accordance with various embodiments, the layer thickness of the second optically translucent, electrically conductive oxide layer (not illustrated) for generating the red color can be in a range of approximately 40 nm to approximately 70 nm, optionally in a range of approximately 50 nm to approximately 60 nm. In various embodiments, the layer thickness of the second optically translucent, electrically conductive oxide layer (not illustrated) for generating the orange color can be in a range of approximately 40 nm to approximately 70 nm, optionally in a range of approximately 50 nm to approximately 60 nm. In various embodiments, the layer thickness of the second optically translucent, electrically conductive oxide layer (not illustrated) for generating the anthracite-gray color can be in a range of approximately 60 nm to approximately 90 nm, optionally in a range of approximately 70 nm to approximately 80 nm.

In accordance with various embodiments, the first optically translucent, electrically conductive oxide layer 829 and the second optically translucent, electrically conductive oxide layer (not illustrated) may include or essentially consist of indium tin oxide (ITO).

In accordance with various embodiments, individual regions of the layer stack for generating the colors can furthermore include a mirror layer (not illustrated) between the smart card module contact layer and the first optically translucent, electrically conductive oxide layer (829).

By way of example, in accordance with various embodiments the region of the layer stack for generating the anthracite-gray color may include a mirror layer (not illustrated) between the smart card module contact layer and the first optically translucent, electrically conductive oxide layer (829).

In various embodiments, the mirror layer (not illustrated) can be formed from or include a metal, e.g. chromium or high-grade steel. In various embodiments, the mirror layer can have a thickness in a range of approximately 40 nm to 70 nm. By way of example, the mirror layer can have a thickness in a range of approximately 50 nm to approximately 60 nm.

In accordance with various embodiments the layer stack 828 of the smart card module 820 can furthermore include a metallic protective layer 830 at least in some regions of the plurality of regions. To put it another way, a topmost (or outermost) layer of the layer stack 828 at least in some regions can be a metallic protective layer 830. In various embodiments, the metallic protective layer 830 may include a plurality of regions of different layer thicknesses, as illustrated by means of the stepped surface line of the protective layer 830 in FIG. 8. In various embodiments, the protective layer 830 can have a thickness in a range of approximately 0 nm to 15 nm. By way of example, the metallic protective layer 830 can have a thickness in a range of approximately 5 nm to approximately 12 nm.

In various embodiments, the metallic protective layer 830 can optionally include iron or gold. In various embodiments, the metallic protective layer 830 can be formed above the first optically translucent, electrically conductive oxide layer 829 or above the second optically translucent, electrically conductive oxide layer (not illustrated).

In accordance with various embodiments, the respective layer thicknesses of the individual layers of the layer stack in each of the plurality of regions can be chosen such that in each case light of a predefined wavelength is generated. In various embodiments, the respective layer thicknesses within the layer stack can be chosen in each of the plurality of regions such that a predefined verification pattern is formed.

The smart card module 820 can have the variations and modifications described above for the smart card modules 220, 230, 240 and 250.

As an alternative to ITO, in various embodiments the oxide layer can be formed from AZO (Al-doped zinc(II) oxide), FTO (F-doped tin(IV) oxide) and ATO (Sb-doped tin(IV) oxide).

The production of a multicolored representation by means of laser removal on a base layer, which can provide different color components by means of interferences at regions of different layer thicknesses, has the following advantages: the method is very flexible with regard to the geometry of the representation. The latter, owing to the varying removal depths, can be configured in a multicolored fashion on the basis of the interference and has a good abrasion resistance, since the base layer is very fixedly connected to the surface of the smart card module, is very thin and consists of metal or metal oxide.

The mirror layer, the optically translucent, electrically conductive oxide layer and the protective layer can be formed by means of PVD.

Furthermore, removing the surface layers of the optically translucent, electrically conductive oxide layer by means of irradiation using a laser can be carried out at the same time as separating the smart card module contacts.

Furthermore, removing surface layers of the optically translucent, electrically conductive oxide layer can be carried out by means of dry etching/sputtering.

Various embodiments make available to the user a possibility as to how the user can verify for example the origin of a smart card module of a smart card simply and rapidly.

Multicolored, almost arbitrarily complex representations are appropriate for this purpose since, on the basis thereof, the user can very easily visually verify the authenticity of the smart card module integrated into the smart card as a result of which the security of the smart card, can be considerably increased. A multicolored representation can as necessary contain a logo, the memorability of which can be very high, as a result of which the verification of the authenticity of the smart card is further simplified. As a result, said multicolored complex representations increase a demanded degree of security.

Said degree of security can be ensured for example by the fact that multicolored representations can be created on the contact region of the smart card modules specifically, to put it another way according to stipulations. In order to produce such multicolored complex representations, there is a need for detailed knowledge and suitable equipment; therefore production is non-trivial, such that for example even a relatively simple multicolored representation, such as a standard logo, for example, offers an increased degree of security as a verification pattern, for the reasons mentioned above.

In various embodiments, a smart card module is provided, including: an electronic circuit in or on a carrier; a smart card module contact layer, which is coupled to the electronic circuit and provides a plurality of smart card module contacts; a mirror layer on the smart card module contact layer, said mirror layer at least partly covering the smart card module contacts; an optically translucent, electrically conductive oxide layer, which covers the mirror layer, wherein the optically translucent, electrically conductive oxide layer includes a plurality of regions of different layer thicknesses for providing different color components.

In various embodiments, the layer thickness of the optically translucent, electrically conductive oxide layer of the smart card module in each of the plurality of regions can be chosen in such a way that in each case light of a predefined wavelength is generated.

In various embodiments, each region of the plurality of regions of the optically translucent, electrically conductive oxide layer of the smart card module can have in each case a layer thickness in a range of approximately 50 nm to approximately 300 nm.

In various embodiments, the layer thickness of the optically translucent, electrically conductive oxide layer of the smart card module for generating a blue color can be in a range of approximately 70 nm to approximately 110 nm, for example in a range of approximately 80 nm to approximately 100 nm; for generating a yellow color, it can be in a range of approximately 120 nm to approximately 180 nm, for example in a range of approximately 135 nm to approximately 165 nm.

In various embodiments, the respective layer thicknesses of the plurality of regions of the optically translucent, electrically conductive oxide layer can be chosen such that a predefined verification pattern is formed.

In various embodiments, the smart card module may include or essentially consist of the optically translucent, electrically conductive oxide layer indium tin oxide (ITO).

In various embodiments, the smart card module can furthermore include a metallic protective layer, which optionally includes iron or gold, above the optically translucent, electrically conductive oxide layer.

In various embodiments, the mirror layer can be a metallic mirror layer, optionally including chromium or iron.

In various embodiments, a smart card is provided, including: a smart card body; and a smart card module in accordance with the features set out above, said smart card module being embedded into the smart card body.

In various embodiments, a method for producing a smart card module is provided, including: forming an electronic circuit in or on a carrier; forming a smart card module contact layer, which is coupled to the electronic circuit and provides a plurality of smart card module contacts; forming a mirror layer on the smart card module contact layer, said mirror layer at least partly covering the smart card module contacts; providing different color components by means of forming an optically translucent, electrically conductive oxide layer, which covers the mirror layer, having a plurality of regions of different layer thicknesses.

In various embodiments, the layer thickness of the optically translucent, electrically conductive oxide layer in each of the plurality of regions can be chosen in such a way that in each case light of a predefined wavelength is generated.

In various embodiments, each region of the plurality of regions can be formed in each case with a layer thickness in a range of approximately 50 nm to approximately 300 nm.

In various embodiments, the layer thickness of the optically translucent, electrically conductive oxide layer for generating a blue color can be formed in a range of approximately 70 nm to approximately 110 nm, for example in a range of approximately 80 nm to approximately 100 nm, and for generating a yellow color can be formed in a range of approximately 120 nm to approximately 180 nm, for example in a range of approximately 135 nm to approximately 165 nm.

In various embodiments, the respective layer thicknesses of the plurality of regions of the optically translucent, electrically conductive oxide layer can be chosen such that a predefined verification pattern is formed.

In various embodiments, the smart card module may include or substantially be formed from the optically translucent, electrically conductive oxide layer indium tin oxide (ITO).

In various embodiments, the method can furthermore include: forming a metallic protective layer, which optionally includes iron or gold, above the optically translucent, electrically conductive oxide layer.

In various embodiments, the mirror layer can be formed as a metallic mirror layer, optionally including chromium or iron.

In various embodiments, a method for producing a smart card is provided, including: producing a smart card body; and embedding a smart card module, such as was described above and will also be described below, into the smart card body.

In various embodiments, a smart card module is provided, including: an electronic circuit in or on a carrier; a smart card module contact layer, which is coupled to the electronic circuit and provides a plurality of smart card module contacts on a front side of the smart card module; a mirror layer on the rear side of the smart card module, which is opposite the front side of the smart card module; an optically translucent, electrically conductive oxide layer, which covers the mirror layer, wherein the optically translucent, electrically conductive oxide layer includes a plurality of regions of different layer thicknesses for providing different color components.

In various embodiments, the layer thickness of the optically translucent, electrically conductive oxide layer in each of the plurality of regions can be chosen in such a way that in each case light of a predefined wavelength is generated.

In various embodiments, each region of the plurality of regions can have in each case a layer thickness in a range of approximately 50 nm to approximately 300 nm.

In various embodiments, the layer thickness of the optically translucent, electrically conductive oxide layer for generating a blue color can be in a range of approximately 70 nm to approximately 110 nm, for example in a range of approximately 80 nm to approximately 100 nm, and for generating a yellow color can be in a range of approximately 120 nm to approximately 180 nm, for example in a range of approximately 135 nm to approximately 165 nm.

In various embodiments, the respective layer thicknesses of the plurality of regions of the optically translucent, electrically conductive oxide layer can be chosen such that a predefined verification pattern is formed.

In various embodiments, the smart card module may include or substantially consist of the optically translucent, electrically conductive oxide layer indium tin oxide (ITO).

In various embodiments, the smart card module can furthermore include: a metallic protective layer, which optionally includes iron or gold, above the optically translucent, electrically conductive oxide layer.

In various embodiments, the mirror layer can be a metallic mirror layer, optionally including chromium or iron.

In various embodiments, a smart card is provided, including: a smart card body; and a smart card module, such as was described above or will also be described below, said smart card module being embedded into the smart card body.

In various embodiments, a method for producing a smart card module is provided, including: forming an electronic circuit in or on a carrier; forming a smart card module contact layer, which is coupled to the electronic circuit and provides a plurality of smart card module contacts on a front side of the smart card module; forming a mirror layer on the rear side of the smart card module, which is opposite the front side of the smart card module; providing different color components by means of forming an optically translucent, electrically conductive oxide layer, which covers the mirror layer, having a plurality of regions of different layer thicknesses.

In various embodiments, a smart card module is provided, including: an electronic circuit in or on a carrier; a smart card module contact layer, which is coupled to the electronic circuit and provides a plurality of smart card module contacts; a layer stack on the smart card module contact layer, said layer stack at least partly covering the smart card module contacts; wherein the layer stack includes a plurality of regions for providing different color components, wherein the layer stack includes at least one optically translucent, electrically conductive oxide layer.

In various embodiments, the layer stack may include at least one second optically translucent, electrically conductive oxide layer, wherein the first optically translucent, electrically conductive oxide layer and the second optically translucent, electrically conductive oxide layer are separated from one another by means of an additional layer.

In various embodiments, the additional layer can be a metallic layer which optionally includes chromium or iron, and has a thickness which is in a range of approximately 3 nm to approximately 20 nm, optionally in a range of approximately 5 nm to approximately 15 nm.

In various embodiments, the layer thickness of the first optically translucent, electrically conductive oxide layer and of the second optically translucent, electrically conductive oxide layer in each of the plurality of regions of the layer stack can be chosen in such way that in each case light of a predefined wavelength is generated.

In various embodiments, the layer thickness of the first optically translucent, electrically conductive oxide layer for generating a red color can be in a range of approximately 120 nm to approximately 150 nm, optionally in a range of approximately 130 nm to approximately 140 nm; for generating an orange color it can be in a range of approximately 90 nm to approximately 120 nm, optionally in a range of approximately 100 nm to approximately 110 nm; and for generating an anthracite-gray color it can be in a range of approximately 40 nm to approximately 70 nm, optionally in a range of approximately 50 nm to approximately 60 nm; and the layer thickness of the second optically translucent, electrically conductive oxide layer for generating the red color can be in a range of approximately 40 nm to approximately 70 nm, optionally in a range of approximately 50 nm to approximately 60 nm; for generating the orange color it can be in a range of approximately 40 nm to approximately 70 nm, optionally in a range of approximately 50 nm to approximately 60 nm; and for generating the anthracite-gray color it can be in a range of approximately 60 nm to approximately 90 nm, optionally in a range of approximately 70 nm to approximately 80 nm.

In various embodiments, the region of the layer stack for generating the anthracite-gray color can furthermore include a mirror layer between the smart card module contact layer and the first optically translucent, electrically conductive oxide layer.

In various embodiments, the mirror layer can be a metallic mirror layer, which optionally includes chromium or iron, and has a thickness which is in a range of approximately 40 nm to approximately 70 nm, optionally in a range of approximately 50 nm to approximately 60 nm.

In various embodiments, the respective layer thicknesses of the layer stack can be chosen such that a predefined verification pattern is formed.

In various embodiments, the optically translucent, electrically conductive oxide layer may include or substantially consist of indium tin oxide (ITO).

In various embodiments, the smart card module can furthermore include: a metallic protective layer, which optionally includes iron or gold, above the optically translucent, electrically conductive oxide layer.

In various embodiments, a smart card is provided, including: a smart card body; and a smart card module in accordance with the features set out above, said smart card module being embedded into the smart card body.

In various embodiments, a method for producing a smart card module in accordance with the features set out above is provided.

The smart card module having a multicolored representation, as described here, or respectively the method for producing a multicolored representation provides a verification pattern which can be used to ensure a demanded degree of security. Multicolored representations, such as patterns or logos, for example, can be provided with the aid of which the user can very easily verify the authenticity of the smart card and of the smart card module integrated therein. An additional factor is that an attractive cosmetic effect can be provided by means of the multicolored representations.

The demanded degree of security can be ensured for example by the fact that multicolored representations can be created on smart card modules according to stipulations, i.e. specifically in accordance with the concepts of the card-issuing office or firm, such as a bank, for example. Even one multicolored representation such as a standard logo, for example, can offer a high degree of security as a verification pattern, for the reasons mentioned above, since detailed knowledge and suitable equipment are required to produce such multicolored representations, for which reason production is non-trivial.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A smart card module, comprising:
an electronic circuit in or on a carrier;
a smart card module contact layer, which is coupled to the electronic circuit and provides a plurality of smart card module contacts;
a mirror layer on the smart card module contact layer, said mirror layer at least partly covering the smart card module contacts;
an optically translucent, electrically conductive oxide layer, which covers the mirror layer, wherein the optically translucent, electrically conductive oxide layer comprises a plurality of regions of different layer thicknesses for providing different color components.

2. The smart card module of claim 1,
wherein the layer thickness of the optically translucent, electrically conductive oxide layer in each of the plurality of regions is chosen in such a way that in each case light of a predefined wavelength is generated.

3. The smart card module of claim 1,
wherein each region of the plurality of regions has in each case a layer thickness in a range of approximately 50 nm to approximately 300 nm.

4. The smart card module of claim 1,
wherein the layer thickness of the optically translucent, electrically conductive oxide layer for generating
a blue color is in a range of approximately 70 nm to approximately 110 nm; and
a yellow color is in a range of approximately 120 nm to approximately 180 nm.

5. The smart card module of claim 1,
wherein the respective layer thicknesses of the plurality of regions of the optically translucent, electrically conductive oxide layer are chosen such that a predefined verification pattern is formed.

6. A smart card, comprising:
a smart card body; and
a smart card module embedded into the smart card body, the smart card module comprising:
an electronic circuit in or on a carrier;
a smart card module contact layer, which is coupled to the electronic circuit and provides a plurality of smart card module contacts;
a mirror layer on the smart card module contact layer, said mirror layer at least partly covering the smart card module contacts;
an optically translucent, electrically conductive oxide layer, which covers the mirror layer, wherein the optically translucent, electrically conductive oxide layer comprises a plurality of regions of different layer thicknesses for providing different color components.

7. A method of producing a smart card module, the method comprising:
forming an electronic circuit in or on a carrier;
forming a smart card module contact layer, which is coupled to the electronic circuit and provides a plurality of smart card module contacts;
forming a mirror layer on the smart card module contact layer, said mirror layer at least partly covering the smart card module contacts;
providing different color components by means of forming an optically translucent, electrically conductive oxide layer, which covers the mirror layer, having a plurality of regions of different layer thicknesses.

8. The method as claimed in claim 7,
wherein the layer thickness of the optically translucent, electrically conductive oxide layer in each of the plurality of regions is chosen in such a way that in each case light of a predefined wavelength is generated.

9. The method as claimed in claim 7,
wherein each region of the plurality of regions is formed in each case with a layer thickness in a range of approximately 50 nm to approximately 300 nm.

10. The method as claimed in claim 7,
wherein the layer thickness of the optically translucent, electrically conductive oxide layer for generating
a blue color is formed in a range of approximately 70 nm to approximately 110 nm; and
a yellow color is formed in a range of approximately 120 nm to approximately 180 nm.

11. The method as claimed in claim 7,
wherein the respective layer thicknesses of the plurality of regions of the optically translucent, electrically conductive oxide layer are chosen such that a predefined verification pattern is formed.

12. A method of producing a smart card, the method comprising:
  producing a smart card body; and
  embedding a smart card module into the smart card body, the smart card module comprising:
  an electronic circuit in or on a carrier;
  a smart card module contact layer, which is coupled to the electronic circuit and provides a plurality of smart card module contacts;
  a mirror layer on the smart card module contact layer, said mirror layer at least partly covering the smart card module contacts;
  an optically translucent, electrically conductive oxide layer, which covers the mirror layer, wherein the optically translucent, electrically conductive oxide layer comprises a plurality of regions of different layer thicknesses for providing different color components.

13. A smart card module, comprising:
  an electronic circuit in or on a carrier;
  a smart card module contact layer, which is coupled to the electronic circuit and provides a plurality of smart card module contacts on a front side of the smart card module;
  a mirror layer on the rear side of the smart card module, which is opposite the front side of the smart card module;
  an optically translucent, electrically conductive oxide layer, which covers the mirror layer, wherein the optically translucent, electrically conductive oxide layer comprises a plurality of regions of different layer thicknesses for providing different color components.

14. The smart card module as claimed in claim 13, wherein the layer thickness of the optically translucent, electrically conductive oxide layer in each of the plurality of regions is chosen in such a way that in each case light of a predefined wavelength is generated.

15. The smart card module as claimed in claim 13, wherein each region of the plurality of regions has in each case a layer thickness in a range of approximately 50 nm to approximately 300 nm.

16. The smart card module as claimed in claim 13, wherein the layer thickness of the optically translucent, electrically conductive oxide layer for generating
  a blue color is in a range of approximately 70 nm to approximately 110 nm; and
  a yellow color is in a range of approximately 120 nm to approximately 180 nm.

17. The smart card module as claimed in claim 13, wherein the respective layer thicknesses of the plurality of regions of the optically translucent, electrically conductive oxide layer are chosen such that a predefined verification pattern is formed.

18. A smart card, comprising:
  a smart card body; and
  a smart card module embedded into the smart card body, the smart card module comprising:
  an electronic circuit in or on a carrier;
  a smart card module contact layer, which is coupled to the electronic circuit and provides a plurality of smart card module contacts on a front side of the smart card module;
  a mirror layer on the rear side of the smart card module, which is opposite the front side of the smart card module;
  an optically translucent, electrically conductive oxide layer, which covers the mirror layer, wherein the optically translucent, electrically conductive oxide layer comprises a plurality of regions of different layer thicknesses for providing different color components.

19. A method of producing a smart card module, the method comprising:
  forming an electronic circuit in or on a carrier;
  forming a smart card module contact layer, which is coupled to the electronic circuit and provides a plurality of smart card module contacts on a front side of the smart card module;
  forming a mirror layer on the rear side of the smart card module, which is opposite the front side of the smart card module;
  providing different color components by means of forming an optically translucent, electrically conductive oxide layer, which covers the mirror layer, having a plurality of regions of different layer thicknesses.

20. A smart card module, comprising:
  an electronic circuit in or on a carrier;
  a smart card module contact layer, which is coupled to the electronic circuit and provides a plurality of smart card module contacts;
  a layer stack on the smart card module contact layer, said layer stack at least partly covering the smart card module contacts;
  wherein the layer stack comprises a plurality of regions for providing different color components,
  wherein the layer stack comprises at least one optically translucent, electrically conductive oxide layer.

21. The smart card module of claim 20, wherein the layer stack comprises at least one second optically translucent, electrically conductive oxide layer, wherein the first optically translucent, electrically conductive oxide layer and the second optically translucent, electrically conductive oxide layer are separated from one another by means of an additional layer.

22. The smart card module of claim 20, wherein the respective layer thicknesses of the layer stack are chosen such that a predefined verification pattern is formed.

23. The smart card module of claim 20, wherein the optically translucent, electrically conductive oxide layer comprises or substantially consists of indium tin oxide.

24. The smart card module of claim 20, further comprising:
  a metallic protective layer, which optionally comprises iron or gold, above the optically translucent, electrically conductive oxide layer.

25. A smart card, comprising:
  a smart card body; and
  a smart card module embedded into the smart card body, the smart card module comprising:
  an electronic circuit in or on a carrier;
  a smart card module contact layer, which is coupled to the electronic circuit and provides a plurality of smart card module contacts;
  a layer stack on the smart card module contact layer, said layer stack at least partly covering the smart card module contacts;
  wherein the layer stack comprises a plurality of regions for providing different color components,
  wherein the layer stack comprises at least one optically translucent, electrically conductive oxide layer.

* * * * *